(12) United States Patent
Lee

(10) Patent No.: US 6,411,764 B1
(45) Date of Patent: Jun. 25, 2002

(54) DOUBLE CORE SPOT SIZE CONVERTER USING SELECTIVE AREA GROWTH AND FABRICATING METHOD THEREOF

(75) Inventor: Jeong-Seok Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/516,483

(22) Filed: Mar. 1, 2000

(30) Foreign Application Priority Data

Nov. 4, 1999 (KR) .......................................... 99-48588

(51) Int. Cl.[7] ................................................. G02B 6/10
(52) U.S. Cl. ......................................... 385/131; 372/50
(58) Field of Search .............................. 372/43, 44, 45, 372/46, 48, 50; 385/14, 130, 131, 132

(56) References Cited

U.S. PATENT DOCUMENTS 4,831,630 A * 5/1989 Scifres et al. ................. 372/50
5,987,046 A * 11/1999 Kobayashi et al. ........... 372/45
6,253,009 B1 * 6/2001 Lestra et al. .................. 372/50

* cited by examiner

Primary Examiner—Cassandra Spyrou
Assistant Examiner—Euncha Cherry
(74) Attorney, Agent, or Firm—Burns, Doane, Swecker & Mathis, L.L.P.

(57) ABSTRACT

A double core spot size converter which is an optical transmit-receive device which is used as an important part in the field related to optical communications and a method for fabricating the double core spot size converter are provided. The double core spot size converter has a double core structure including a lower passive waveguide and an upper passive waveguide and active waveguide, between which a spacer having a thickness of about 0.3 μm is interleaved. According to the method, the upper passive waveguide is simultaneously grown along with the active waveguide through a selective area growth (SAG) method using a SAG pattern such that a negative taper structure, in which the thickness gradually becomes thinner from the active waveguide toward a beam emitting facet, is formed and a composition is different according to the thickness.

14 Claims, 6 Drawing Sheets

DOUBLE CORE SPOT SIZE CONVERTER USING SELECTIVE AREA GROWTH AND FABRICATING METHOD THEREOF

This application claims priority under 35 U.S.C. §§119 and/or 365 to 99-48598 filed in Korea on Nov. 4, 1999; the entire content of which is hereby incorporated by reference.

BACKGROUND OF THE INVENTION

1. Field of the Invention

The present invention relates to a spot size converter which is an optical transceiver device used as an important part of the field related to optical communications, and more particularly, to a double core spot size converter, in which a double core for spot size conversion of an optical beam is fabricated by a selective area growth method, and a method for fabricating the double core spot size converter.

2. Description of the Related Art

In optical communications, a spot size converter is usually used for converting the spot size of an optical beam which is emitted from an optical device to a beam size within the optical device and applying the spot size converted optical beam to an optical fiber so that the optical beam may have the same size within the optical device, which is the source of an optical signal, and the optical fiber, which is an optical signal transmitting medium. The spot size converter is usually applied to a laser diode, a semiconductor optical amplifier, a modulator, a photodetector or a wavelength converter.

To reach the optical communication age earlier, it is essential to reduce the prices of parts related to the optical communication. To reduce the price of parts related to optical transmission and reception, an optical device which does not use a lens has been fabricated in the form of a package. To fabricate optical devices having high optical coupling efficiency without a lens, beam sizes in an optical device and an optical fiber must be similar to each other. However, generally, the beam is a very large size, about 9 $\mu$m, in an optical fiber while the beam size is about 1 $\mu$m in a semiconductor optical device. Because of the large difference between the beam sizes in the optical device and the optical fiber, optical coupling efficiency is quite poor. To overcome the problem, a method of coupling a spot size converter (SSC) for enlarging the mode size at the end of a device has been developed.

FIG. 1 is a partially sectioned perspective view for showing the structure of a conventional double core SSC. As shown in FIG. 1, an active waveguide 10 has a negative taper in a lateral or vertical direction and a passive waveguide 20 has a positive taper so that the mode which is locked to the active waveguide 10 can be adiabatically passed to the passive waveguide 20. In this structure, the beam size of a device can be adjusted using a passive waveguide only.

In other words, according to the conventional technology shown in FIG. 1, etching is performed in the lateral direction to give a negative taper to the active waveguide 10 for the purpose of reducing the confines of the active waveguide 10. To implement this method, lateral etching is essential and accurate control of the etching rate is also required because only the passive waveguide 20 must exist in a SSC region. That is, a conventional SSC is fabricated such that wet or dry etching is used in forming a waveguide to achieve a small optical confinement factor and to thus increase the beam size.

Conventional SCC fabrication methods can be classified into four groups, as shown in Table 1. Advantages and disadvantages of each method are arranged in Table 1. Other than a selective area growth (SAG) method, it is essential to adjust the width of a waveguide to 0.2 $\mu$m or less by performing accurate etching. On the other hand, according to the SAG method, crystallinity of an active layer is sacrificed for a narrow beam divergence angle and an accurate design and fabrication process of a waveguide are required to obtain a circular beam. In a butt-joint method, it is very difficult to ensure a crystal growth condition in which smooth transition of a mode can be achieved between a SSC region and an active region. Thus, such method requires much time and study. In the case of a double core structure, an active waveguide is tapered in a lateral or vertical direction to increase the mode size so that mode in the active waveguide can be coupled to an underlying passive waveguide, thereby adjusting the beam divergence angle. Because the refractive index, thickness and width of the passive waveguide can be adjusted regardless of the active waveguide, the beam size can be easily adjusted. Since this method employing the double core structure requires stable adjustment of etching Width and depth, it is essential to ensure a dry etching process. However, it is very difficult to obtain a smooth profile in a tapered region when using the dry etching process. In the case of adjusting the width of a waveguide by using an etching method to adjust the beam size, it happens that the end of the waveguide having a very narrow width is collapsed at a high temperature by a mass transport phenomenon during a regrowth for making a buried heterostructure, thereby warping the shape of a beam.

TABLE 1

|  | Structure | Advantages | Disadvantages | Remarks |
| --- | --- | --- | --- | --- |
| Etching method | The size of the waveguide is adjusted in a lateral or vertical direction. | The growth process is simple. | The process is very complicated. | U.S. Pat. No. 5,153,935<br>U.S. Pat. No. 4,932,032 |
| SAG method | The size of the waveguide is adjusted in a vertical direction. | The process is very simple. | The growth process is difficult | U.S. Pat. No. 5,657,338 |
| Butt-joint | An active region and a SSC region are grown separately. | Each region can be optimized. | The growth process is very difficult | NTT |
| Double core | While maintaining the characteristic of an active layer, the beam | Beam divergence can be adjusted using the passive | The process is very complicated. | U.S. Pat. No. 3,978,426<br>U.S. Pat. No. 5,574,742<br>U.S. Pat. No. 5,278,926 |

| Structure | Advantages | Disadvantages | Remarks |
|---|---|---|---|
| size is adjusted using a waveguide passive waveguide. | | | U.S. Pat. No. 5,844,929 |

SUMMARY OF THE INVENTION

To solve the above problems, it is an objective of the present invention to provide a double core spot size converter and a fabrication method thereof, for improving the optical coupling efficiency between an optical device and an optical fiber by reducing astigmatism and the far field angle of a beam emitted from the optical device.

Accordingly, to achieve the above objective, there is provided a double core spot size converter including a lower clad layer, a lower passive waveguide which is formed on the lower clad layer to a predetermined width and thickness and determines the pattern of an emitted beam, a spacer which is formed on the lower passive waveguide to a predetermined thickness, an active waveguide which is formed on the spacer to a predetermined thickness, an upper passive waveguide which is formed in the shape of a negative taper connected to the active waveguide without a break on the spacer, for spot size conversion, and an upper clad layer which is formed on the active waveguide and the upper passive waveguide.

In the present invention, the lower passive waveguide is at least 0.3 $\mu$m wide and has a thickness of 1 $\mu$m or less. The spacer has a thickness of 3 $\mu$m or less. In the taper structure of the upper passive waveguide, the increase in thickness has a ratio of at least 1.5. The upper passive waveguide is formed such that its end meeting a beam emitted facet stops in advance of the end of the lower passive waveguide to allow a mode transition from the upper passive waveguide to the lower passive waveguide. The lower clad layer is formed of n-InP. The lower passive waveguide is formed of InGaAsP. The spacer is formed of InP. The active waveguide and the upper passive waveguide are formed of InGaAsP. The upper clad layer is formed of p-InP. The double core spot size converter also includes first and second current blocking layers which are formed of p-InP and n-InP, respectively, on both sides of the waveguides, for insulation.

There is also provided a method for fabricating a double core spot size converter. The method includes the steps of (a) sequentially growing a lower passive waveguide and a spacer on a lower clad layer acting as a substrate, (b) forming a selective area growth pattern on the spacer and simultaneously growing an upper passive waveguide, which is a spot size conversion area in a tapered structure, and an active waveguide, which is an active area, using selective area growth, (c) partially removing a thin portion at the edge of the tapered structure by performing an etching process on the upper passive waveguide to complete the upper passive waveguide, (d) partially etching the portion of the clad layer under the side of a waveguide comprising the upper passive waveguide and the active waveguide and performing a regrowth process on the etched portion to grow first and second current blocking layers, forming an insulation structure, and (e) growing an upper clad layer on an exposed portion of the upper passive waveguide, the active waveguide and the first and second current blocking layers.

In the step (a), the lower passive waveguide is grown to a thickness of 1 $\mu$m or less, and the spacer is grown to a thickness of 3 $\mu$m or less. In the step (b), the upper passive waveguide is grown by the selective area growth such that the increase in thickness has a ratio of at least 1.5. In the step (c), the upper passive waveguide is etched such that its end meeting a beam emitted facet stops in advance of the end of the lower passive waveguide to allow a mode transition from the upper passive waveguide to the lower passive waveguide. In the step (d), the lower passive waveguide is formed to have a width of at least 0.3 $\mu$m. The lower clad layer is formed of n-InP. The lower passive waveguide is formed of InGaAsP. The spacer is formed of InP. The active waveguide and the upper passive waveguide are formed of InGaAsP. The upper clad layer is formed of p-InP. The first current blocking layer is formed of p-InP. The second current blocking layer is formed of n-InP.

BRIEF DESCRIPTION OF THE DRAWINGS

The above objective and advantages of the present invention will become more apparent by describing in detail preferred embodiments thereof with reference to the attached drawings in which.

DETAILED DESCRIPTION OF THE INVENTION

In the present invention, instead of an etching method, a selective area growth (SAG) method is used to adjust the mode size in an active device so that the mode is moved to a passive waveguide, thereby adjusting a beam divergence angle. In other words, a spot size converter (SSC) area for decreasing the confinement of the mode to an active waveguide is made by the SAG method and the mode is transferred from the active waveguide to an underlying passive waveguide, thereby realizing a double core SSC of good quality without using a very complicated etching process. The implementation of a SSC using the SAG method simplifies processes of optical parts production, thereby decreasing the price of a product. Therefore, the present invention is deemed to be very advantageous to the construction of optical communication systems.

Figure 1:
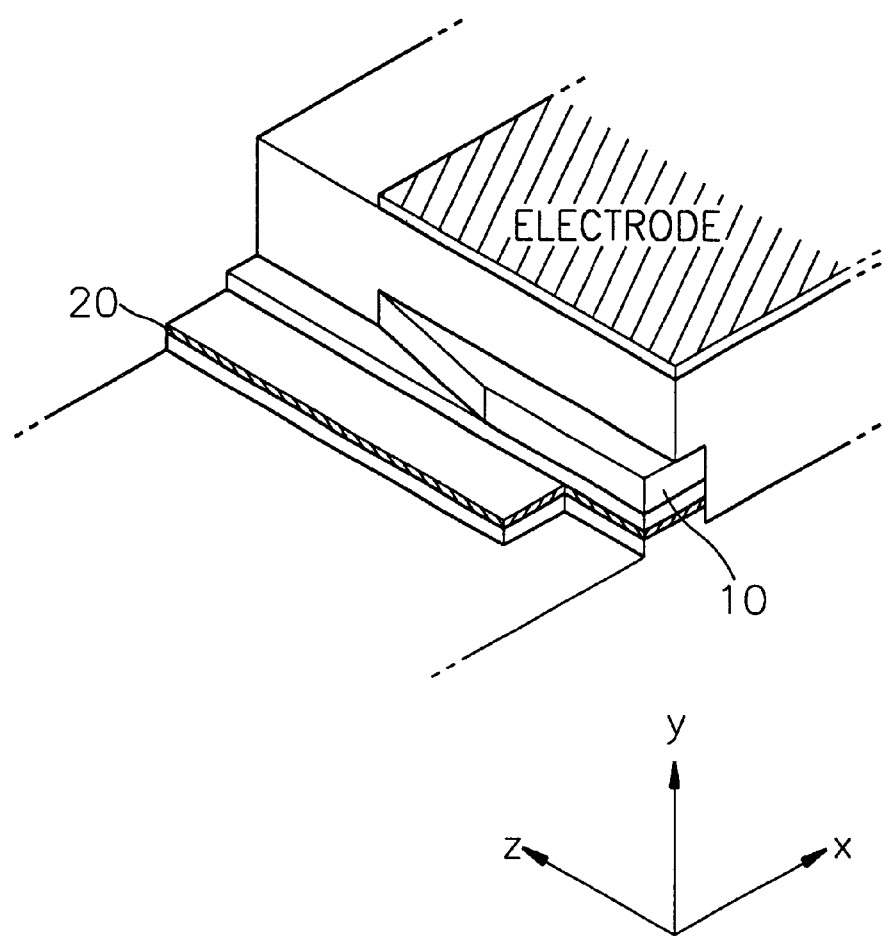
FIG. 1 is a partially sectioned perspective view for showing the structure of a conventional double core spot size converter (SSC)
Figure 2A:
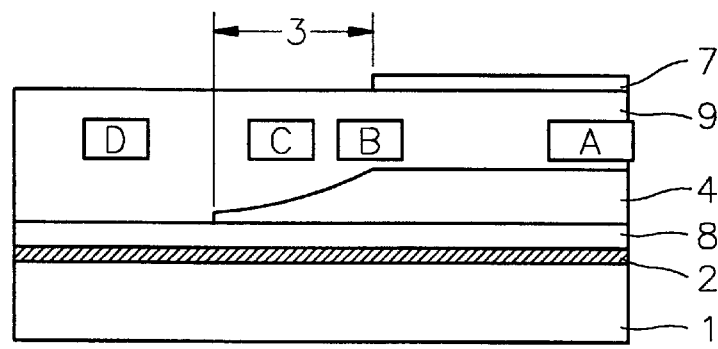
FIG. 2A is a vertical sectional view for showing the structure of a double core SCC according to the present invention.
Figure 2B:
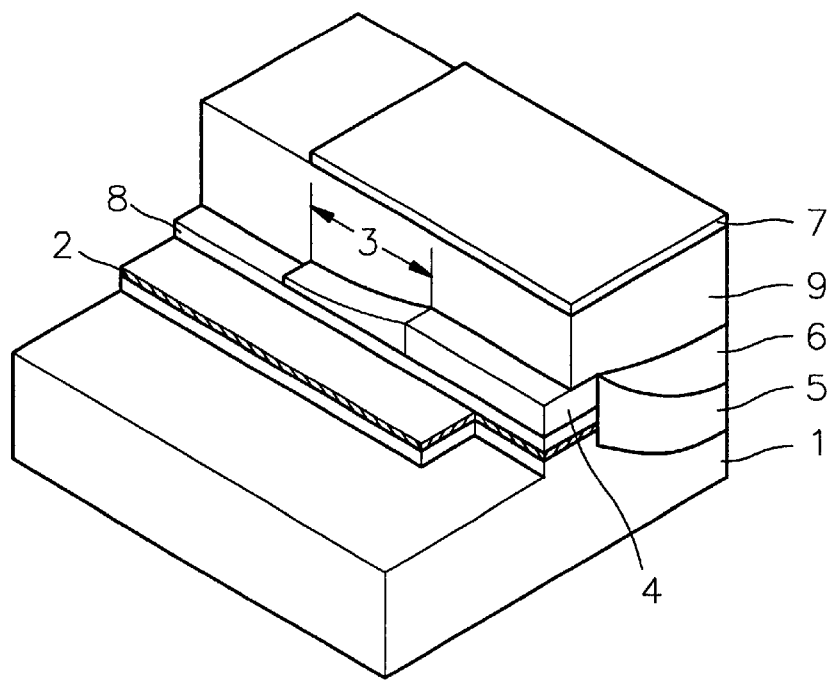
FIG. 2B is a partially sectioned perspective view for showing the structure of the double core SCC according to the present invention.

FIGS. 2A and 2B are a vertical sectional view and a partially sectioned perspective view taken along a waveguide direction, for showing a schematic structure of a double core SSC according to the present invention. The double core SSC of the present invention includes two cores, that is, a lower passive waveguide 2, and an upper passive waveguide 3 and an active waveguide 4, between which a spacer 8 is interleaved, to convert a spot size. The upper passive waveguide 3 becomes thinner toward to a facet from which a beam is emitted and has a different composition depending on its thickness. The width of the upper passive waveguide 3 near the beam emitting facet is equal to that of the active waveguide 4 or wider than that of the active waveguide 4. The lower passive waveguide 2 is formed to a thickness of 1 $\mu$m or less and to a width of at least 0.3 $\mu$m. The spacer 8 is formed to a thickness of at least 3 $\mu$m.

In a waveguide having such a structure, the mode is moved from the active waveguide 4 to the lower passive waveguide 2. More specifically, the upper passive waveguide 3, which is formed by the SAG without an additional etching process, is thinner than the active waveguide 4 and has a lowered refractive index so that the mode size in the upper passive waveguide 3 is larger than in the active waveguide 4, even though the width of the upper passive guide 3 is equal to that of the active waveguide 4. By using the characteristic of the upper passive guide 3 which is thinner and has a lowered refractive index compared to the active waveguide 4, adiabatic transition of the mode is achieved from the active waveguide 4 to the upper passive waveguide 3, which is formed by the SAG and acts as a SSC. The mode, which is enlarged by the upper passive waveguide acting as the SSC, is moved to the lower passive waveguide 2, which is formed under the upper passive waveguide 3 before the SAG. The mode is sufficiently moved to the underlying lower passive waveguide 2 so as to be removed from the upper passive waveguide 3 which acts as the SSC so that the entire mode is confined to the lower passive waveguide 2. The beam profile can be adjusted by adjusting the width, thickness and refractive index of the lower passive waveguide 2.

Reference numerals 1, 3, 5, 6, 7 and 9 indicate a lower clad layer, the upper passive waveguide (namely, a spot size conversion area), a first current blocking layer, a second current blocking layer, an electrode and an upper clad layer, respectively. The first and second current blocking layers 5 and 6 are doped with materials having opposite polarities, respectively, and serve as electrical insulating layers.

Figure 3A:
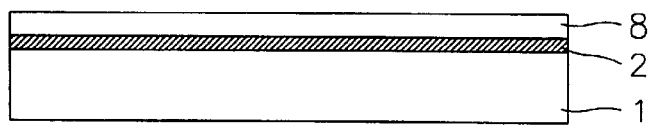
FIGS. 3A through 3D are vertical sectional views and a partially sectioned perspective view for showing the steps of the fabrication method of the double core SSC depicted in FIGS. 2A and 2B.
Figure 3B:
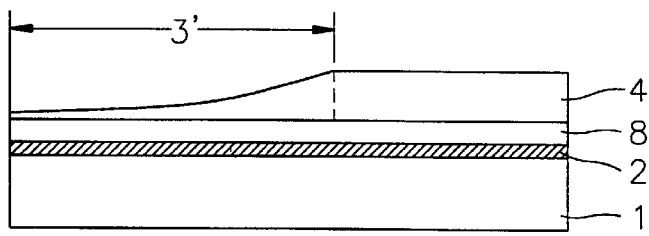
Figure 3C:
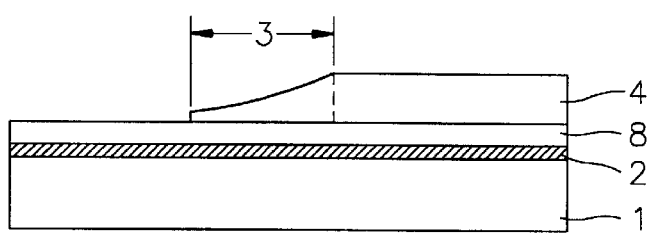
Figure 3D:
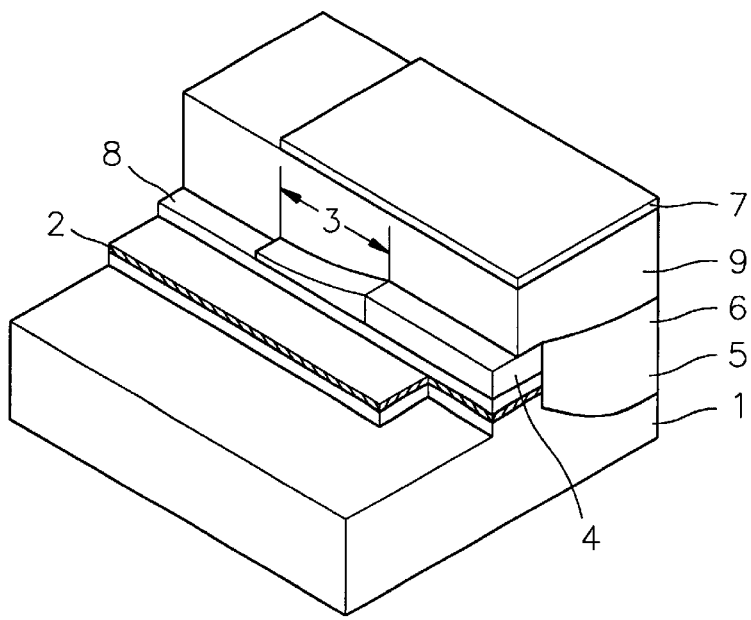

FIGS. 3A through 3D are views for showing the steps of a fabrication method of a double core SSC. FIGS. 3A through 3C are vertical sectional views and FIG. 3D is a partially sectioned perspective view.

As shown in FIG. 3A, a passive waveguide 2 and an InP spacer 8 are grown on a lower clad layer 1 which acts as a substrate.

Next, as shown in FIG. 3B, a dielectric mask is formed on the spacer 8 to form a SAG pattern. An upper waveguide 3' and 4, which is composed of a spot size conversion area, namely, a passive waveguide 3', and an active area 4, is grown by the SAG. As a result of the SAG, the upper passive waveguide 3' is formed to have a negative taper in a vertical direction while the active waveguide 4 is formed to have a uniform thickness in the vertical direction.

Thereafter, as shown in FIG. 3C, a simple etching process is performed on the upper passive waveguide 3' of FIG. 3B to partially remove a thin portion near the edge of the layer which is formed by the SAG, thereby forming the upper passive waveguide 3 which acts a SSC.

Next, as shown in FIG. 3D, a clad layer at the side of the waveguide including the upper passive waveguide 3 and the active waveguide 4 is etched. A regrowth process is performed on the etched portion to grow different polarity layers 5 and 6, thereby forming an insulating structure. An upper clad layer 9 is grown on a resultant structure, thereby forming a buried heterostructure. A reference numeral 7 is an electrode.

Figure 4:
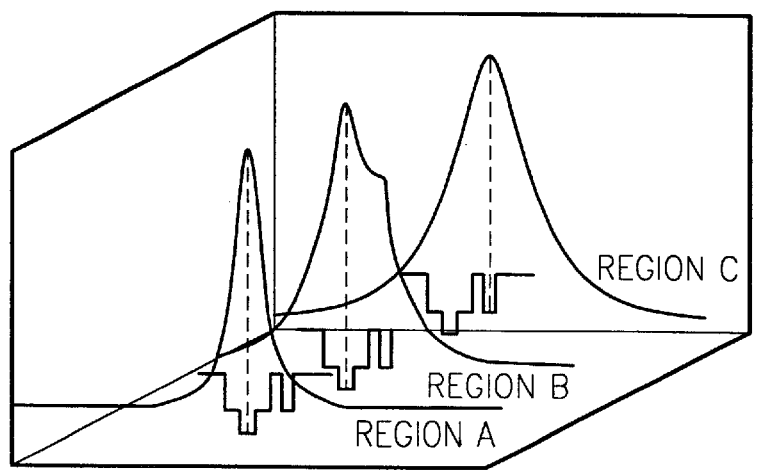
FIG. 4 is a graph for typically showing mode transition of the double core SSC depicted in FIGS. 2A and 2B.

The operation of the double core SSC fabricated through the above method will be described. FIG. 4 shows the change in distribution of a mode when the mode transfers from the active waveguide 4 to the lower passive waveguide 2 in the structure, as shown in FIGS. 2A and 2B. Referring to FIG. 4, it is evident that at least 95% of the mode is confined to the active waveguide 4 in a region A of FIG. 2A. The operations (amplification, modulation and absorption) of a device at the active waveguide 4 are not influenced by the passive waveguides 2 and 3. In a region B of FIG. 2A, the area of the active waveguide 4 gradually ends and the upper passive waveguide 3 begins so that the mode is transferred from the active waveguide 4 to the upper passive waveguide 3. In region C of FIG. 2A, the mode is transferred from the upper passive waveguide 3 to the lower passive waveguide 2. Before the upper passive waveguide 3 ends, at least 50% of the mode is transferred to the lower passive waveguide 2 so that adiabatic transition of the mode is achieved from the upper passive waveguide 3 to the lower passive wave guide 2. In region D of FIG. 2A, the mode is confined to only the lower passive waveguide 2. In the above mode transition, it is confirmed by a BPM method that the adiabatic mode transition is achieved in the transition regions B and C. In addition, optimal conditions for the thickness and refractive index of the spacer are guaranteed by simulation.

EMBODIMENT

Figure 5:
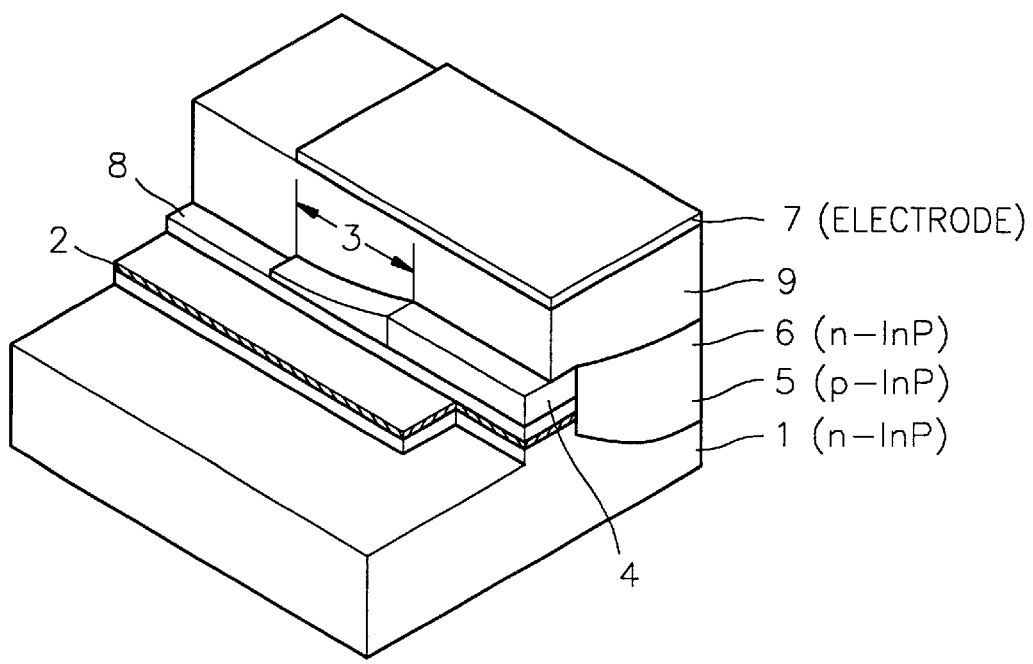
FIG. 5 is a partially sectioned perspective view of an embodiment of the present invention.

As shown in FIG. 5, an InGaAsP lower passive waveguide 2 and an InP spacer 8 are sequentially stacked on an n-InP lower clad layer 1 which acts as a substrate. An InGaAsP upper passive waveguide 3 and an InGaAsP active waveguide 4 are simultaneously formed on the InP spacer 8 in one direction. A p-InP upper clad layer 9 and an electrode 7 are sequentially formed on a resultant structure. Both sides of the structure including the upper and lower waveguides 2, 3, and 4 and the spacer 8 are etched to form a p-InP first current blocking layer 5 and an n-InP second current blocking layer 6, thus burying the central waveguide structure.

Figure 6A:
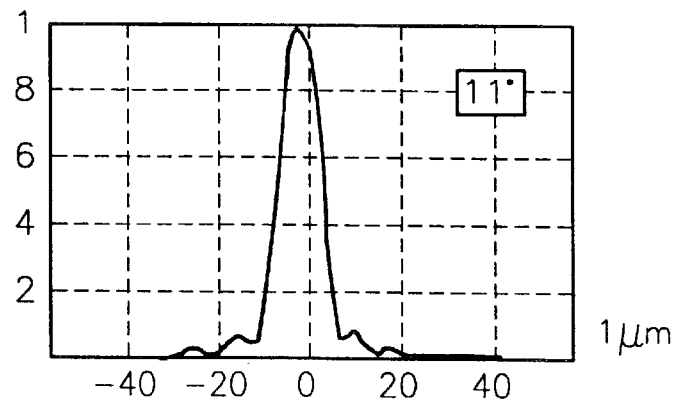
FIGS. 6A through 6D are graphs for showing horizontal far-field patterns (FFPs) when the width of a passive waveguide near a facet in the embodiment shown in FIG. 5 is formed to be 1 $\mu$m, 2 $\mu$m, 3 $\mu$m and 4 $\mu$m.
Figure 6B:
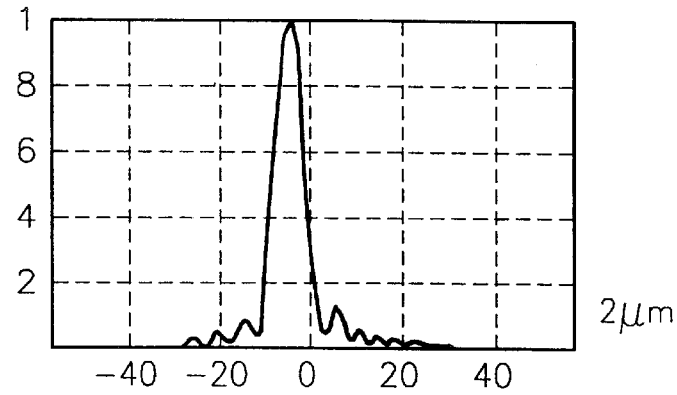
Figure 6C:
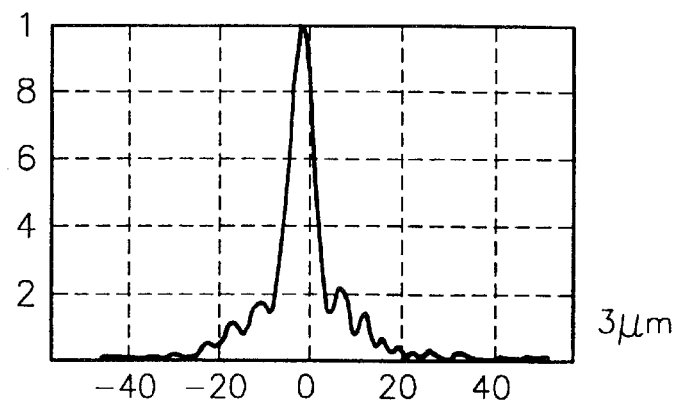
Figure 6D:
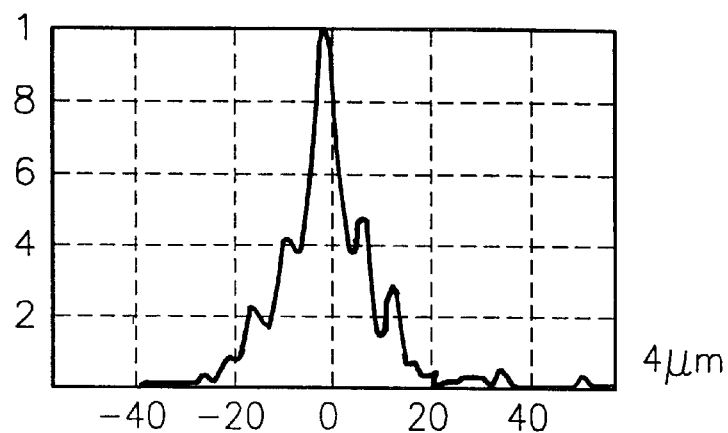
Figure 7:
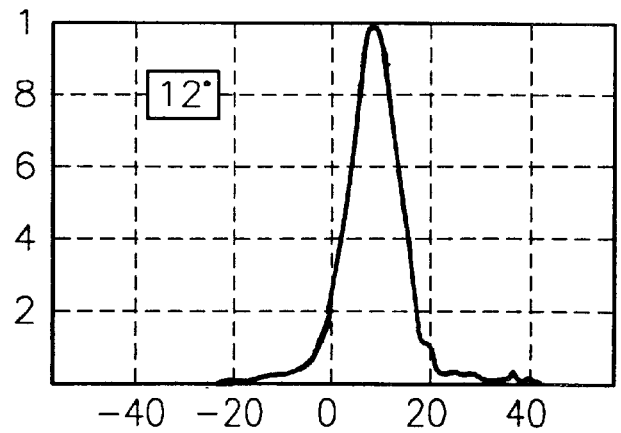
FIG. 7 is a graph for showing a vertical FFP in the embodiment shown in FIG. 5.

FIGS. 6A through 6D and 7 show far-field patterns (FFPs) of a beam in a structure in which the lower passive waveguide 2 of FIG. 5 is formed of InGaAsP having a wavelength of 1.1 $\mu$m to a thickness of 0.15 $\mu$m under the active waveguide 4, and the InP spacer 8 having a thickness of 0.3 $\mu$m is interleaved between the lower passive waveguide 2 and the active waveguide 4. FIGS. 6A through 6D show horizontal FFPs of emitted beams depending on the width of the upper passive waveguide 3 of FIG. 5 near a beam emitting facet and FIG. 7 shows a vertical FFP. More specifically, FIG. 6A shows a FFP when the width of the upper passive waveguide 3 near the beam emitting facet is 1 $\mu$m which is equal to that of the active waveguide 4. FIG. 6B shows a FFP when the width of the upper passive waveguide 3 near the beam emitting facet is 2 μm. FIGS. 6C and 6D show FFPs when the width of the upper passive waveguide 3 near the beam emitting facet is 3 μm and 4 μm, respectively. The vertical FFP shown in FIG. 7 is the same regardless of the width of the upper passive waveguide 3 near the beam emitting facet in the above four cases because the vertical FFP is adjusted by the thickness and refractive index of the upper passive waveguide 3. From each of the FFPs in FIGS. 6A through 6D and the FFP of FIG. 7, a full width half maximum (FWHM) and a beam divergence angle can be obtained.

For example, referring to FIGS. 6A and 7, when the width of the upper passive waveguide 3 near the beam emitting facet is 1 μm which is equal to the width of the active waveguide 4, a FWHM of the FFP of 11°×12° is obtained with respect to the horizontal and vertical directions. When compared to the conventional technology using only the SAG method in which a very asymmetry FFP of 8°×15° is obtained, a FFP of an approximately circular beam can be obtained when using the method according to the present invention. In other words, an output beam having approximately no astigmatism can be obtained.

As described above, a double core spot size converter according to the present invention has a double core structure including a lower passive waveguide and an upper passive waveguide and active waveguide, between which a spacer having a thickness of about 0.3 μm is interleaved. The present invention also simultaneously grows the upper passive waveguide along with the active waveguide through a SAG method using a SAG pattern such that a negative taper structure, in which the thickness of the upper passive waveguide gradually becomes thinner from the active waveguide toward a beam emitting facet, is formed and the composition of the upper passive waveguide is different according to its thickness. This structure is different from a conventional double core structure formed by an etching method. The method using the SAG is advantageous in implementing a double core SSC having better performance. If only SAG conditions are guaranteed, double core SSCs having a very small beam divergence angle can be produced in a large yield through a simple etching process.

What is claimed is:

1. A double core spot size converter comprising:
   a lower clad layer;
   a lower passive waveguide which is formed on the lower clad layer to a predetermined width and thickness and determines a pattern of an emitted beam;
   a spacer which is formed on the lower passive waveguide to a predetermined thickness;
   an active waveguide which is formed on the spacer to a predetermined thickness;
   an upper passive waveguide which is formed in a shape of a negative taper connected to the active waveguide without a break on the spacer, for spot size conversion; and
   an upper clad layer which is formed on the active waveguide and the upper passive waveguide.

2. The double core spot size converter of claim 1, wherein the lower passive waveguide is at least 0.3 μm wide.

3. The double core spot size converter of claim 1, wherein the lower passive waveguide has a thickness of 1 μm or less.

4. The double core spot size converter of claim 1, wherein the spacer has a thickness of 3 μm or less.

5. The double core spot size converter of claim 1, wherein in the taper structure of the upper passive waveguide, an increase in thickness has a ratio of at least 1.5.

6. The double core spot size converter of claim 1, wherein the upper passive waveguide is formed such that its end meeting a beam emitted facet stops in advance of the end of the lower passive waveguide to allow a mode transition from the upper passive waveguide to the lower passive waveguide.

7. The double core spot size converter of claim 1, further comprising first and second current blocking layers which are formed of p-InP and n-InP, respectively, on both sides of the waveguides, for insulation, wherein the lower clad layer is formed of n-InP, the lower passive waveguide is formed of InGaAsP, the spacer is formed of InP, the active waveguide and the upper passive waveguide are formed of InGaAsP, the upper clad layer is formed of p-InP.

8. A method for fabricating a double core spot size converter, the method comprising the steps of:
   (a) sequentially growing a lower passive waveguide and a spacer on a lower clad layer acting as a substrate;
   (b) forming a selective area growth pattern on the spacer and simultaneously growing an upper passive waveguide, which is a spot size conversion area in a tapered structure, and an active waveguide, which is an active area, using selective area growth;
   (c) partially removing a thin portion at the edge of the tapered structure by performing an etching process on the upper passive waveguide to complete the upper passive waveguide;
   (d) partially etching the portion of the clad layer under the side of a waveguide comprising the upper passive waveguide and the active waveguide and performing a regrowth process on the etched portion to grow first and second current blocking layers, forming an insulation structure; and
   (e) growing an upper clad layer on an exposed portion of the upper passive waveguide, the active waveguide and the first and second current blocking layers.

9. The method of claim 8, wherein, in the step (a), the lower passive waveguide is grown to a thickness of 1 μm or less.

10. The method of claim 8, wherein, in the step (a), the spacer is grown to a thickness of 3 μm or less.

11. The method of claim 8, wherein, in the step (b), the upper passive waveguide is grown by the selective area growth such that the increase in thickness has a ratio of at least 1.5.

12. The method of claim 8, wherein, in the step (c), the upper passive waveguide is etched such that its end meeting a beam emitted facet stops in advance of the end of the lower passive waveguide to allow a mode transition from the upper passive waveguide to the lower passive waveguide.

13. The method of claim 8, wherein, in the step (d), the lower passive waveguide is formed to have a width of at least 0.3 μm.

14. The method of claim 8, wherein the lower clad layer is formed of n-InP, the lower passive waveguide is formed of InGaAsP, the spacer is formed of InP, the active waveguide and the upper passive waveguide are formed of InGaAsP, the upper clad layer is formed of p-InP, the first current blocking layer is formed of p-InP, and the second current blocking layer is formed of n-InP.

* * * * *